(12) United States Patent
Adut et al.

(10) Patent No.: US 8,693,601 B2
(45) Date of Patent: Apr. 8, 2014

(54) SELF-CORRECTING MULTIRATE FILTER

(75) Inventors: Victor Adut, Arlington Heights, IL (US); Gregory M. Agami, Arlington Heights, IL (US); Yun H. Kim, Bartlett, IL (US); Wei Chuan Ma, Wauconda, IL (US)

(73) Assignee: Intel Corporation, Santa Clara, CA (US)

( * ) Notice: Subject to any disclaimer, the term of this patent is extended or adjusted under 35 U.S.C. 154(b) by 165 days.

(21) Appl. No.: 13/342,258

(22) Filed: Jan. 3, 2012

(65) Prior Publication Data

US 2013/0170531 A1 Jul. 4, 2013

(51) Int. Cl.
*H04B 1/10* (2006.01)

(52) U.S. Cl.
USPC ........... 375/350; 375/224; 375/340; 375/226; 375/346; 375/316; 455/203; 455/303; 370/310

(58) Field of Classification Search
USPC ................. 375/226, 224, 350, 346, 316, 340; 455/203, 303; 370/310
See application file for complete search history.

(56) References Cited

U.S. PATENT DOCUMENTS

| 5,926,455 | A | * | 7/1999 | Allpress | 370/210 |
| 6,141,671 | A | | 10/2000 | Adams et al. | |
| 6,904,111 | B1 | | 6/2005 | Kolze et al. | |
| 7,095,781 | B1 | * | 8/2006 | Hsu et al. | 375/224 |
| 7,133,647 | B2 | | 11/2006 | Dent | |
| 7,339,504 | B1 | * | 3/2008 | Li | 341/61 |
| 7,345,600 | B1 | | 3/2008 | Fedigan | |
| 7,369,637 | B1 | | 5/2008 | Mauer | |
| 7,498,957 | B2 | | 3/2009 | De Buys | |
| 7,567,641 | B2 | | 7/2009 | Kamath | |
| 8,073,894 | B1 | * | 12/2011 | Dasgupta et al. | 708/819 |
| 8,499,019 | B2 | * | 7/2013 | Liu et al. | 708/313 |
| 2004/0120361 | A1 | | 6/2004 | Yu et al. | |
| 2006/0003757 | A1 | | 1/2006 | Subramanian et al. | |
| 2008/0316912 | A1 | * | 12/2008 | Al Adnani | 370/210 |
| 2009/0319065 | A1 | | 12/2009 | Risbo | |
| 2010/0321216 | A1 | * | 12/2010 | Jonsson et al. | 341/61 |
| 2011/0254711 | A1 | * | 10/2011 | Jonsson et al. | 341/61 |
| 2012/0051407 | A1 | | 3/2012 | Ji et al. | |

* cited by examiner

*Primary Examiner* — Kenneth Lam
(74) *Attorney, Agent, or Firm* — Schwabe, Williamson & Wyatt, P.C.

(57) ABSTRACT

A system includes a polyphase multirate filter and a controller which, responsive to detecting a data stream: measures a current phase relationship between a current resampling filter input clock signal and a current multirate output clock signal; identifies, based on a mapping of the measured phase relationship within a pre-generated quantized mapping table, an initial polyphase filter coefficient index corresponding to the measured phase relationship; selects, based on the initial polyphase filter coefficient index identified, a corresponding polyphase filter component from within the multirate filter; configures the multirate filter to pass data from the data stream through the corresponding polyphase filter component to generate an initial output data sample; updates the initial polyphase filter coefficient index to a calculated next polyphase filter coefficient index value, in response to a request for generation of a next output data sample; and self-corrects the multirate filter responsive to a pre-identified error condition.

21 Claims, 9 Drawing Sheets

| MEASUREMENT COUNTER 505 | INITIAL POLYPHASE COMPONENT INDEX (n) 510 | MEASUREMENT COUNTER 505 | INITIAL POLYPHASE COMPONENT INDEX (n) 510 |
|---|---|---|---|
| 0, 1 | 0 | 22, 23, 24 | 9 |
| 2, 3 | 1 | 25, 26 | 10 |
| 4, 5, 6 | 2 | 27, 28, 29 | 11 |
| 7, 8 | 3 | 30, 31, 32 | 12 |
| 9, 10, 11 | 4 | 33, 34 | 13 |
| 12, 13, 14 | 5 | 35, 36, 37 | 14 |
| 15, 16 | 6 | 38, 39 | 15 |
| 17, 18, 19 | 7 | 40, 41 | 16 |
| 20, 21 | 8 | | |

Input clock Freq: 1.2288 MHz
Output Clk Freq: 1.92MHz
Measurement Clk Freq: 78.64 MHz

FIG. 5

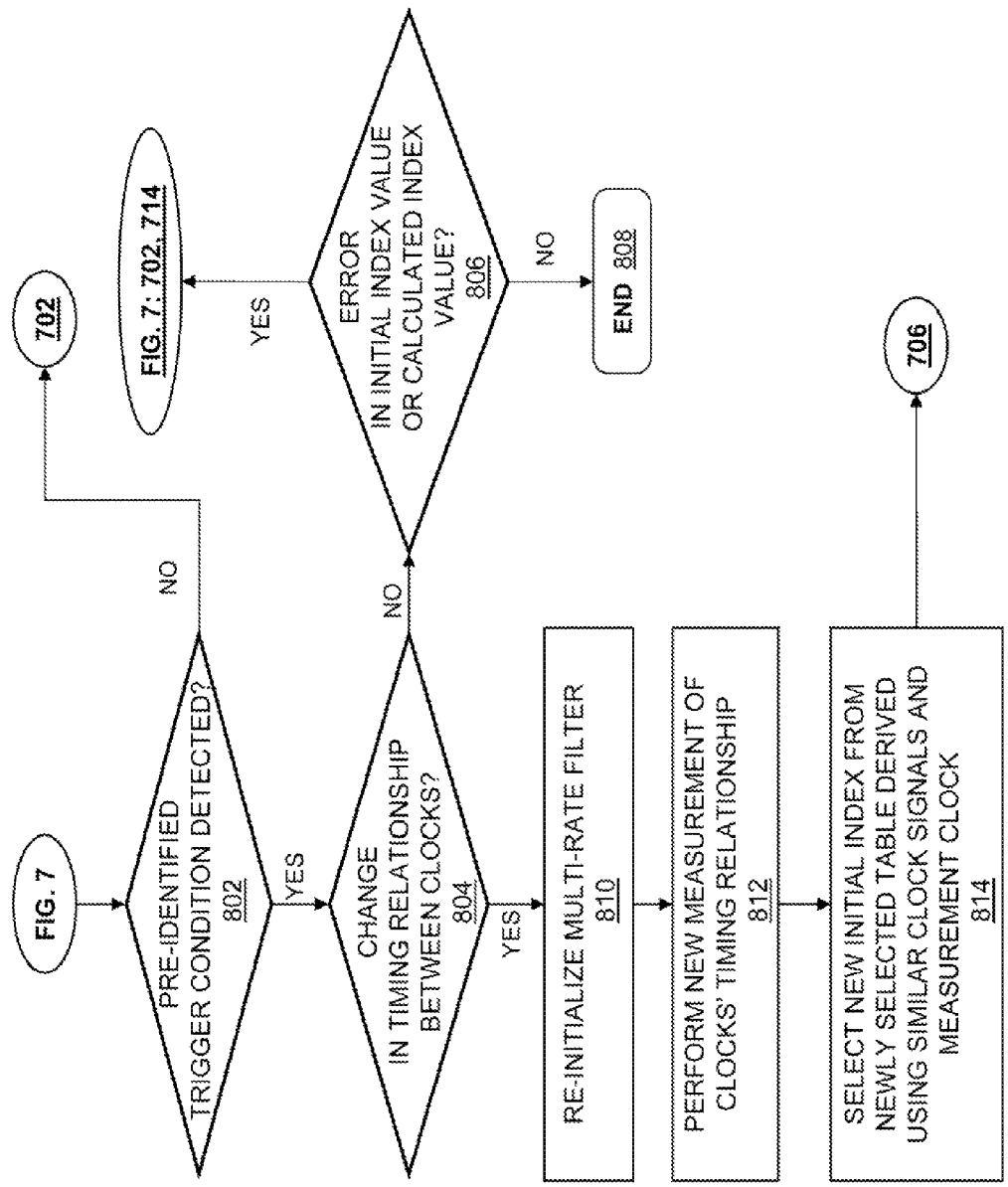

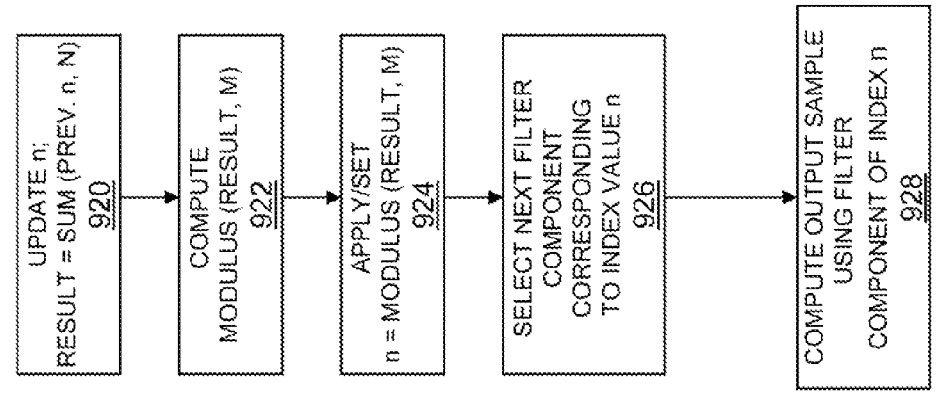
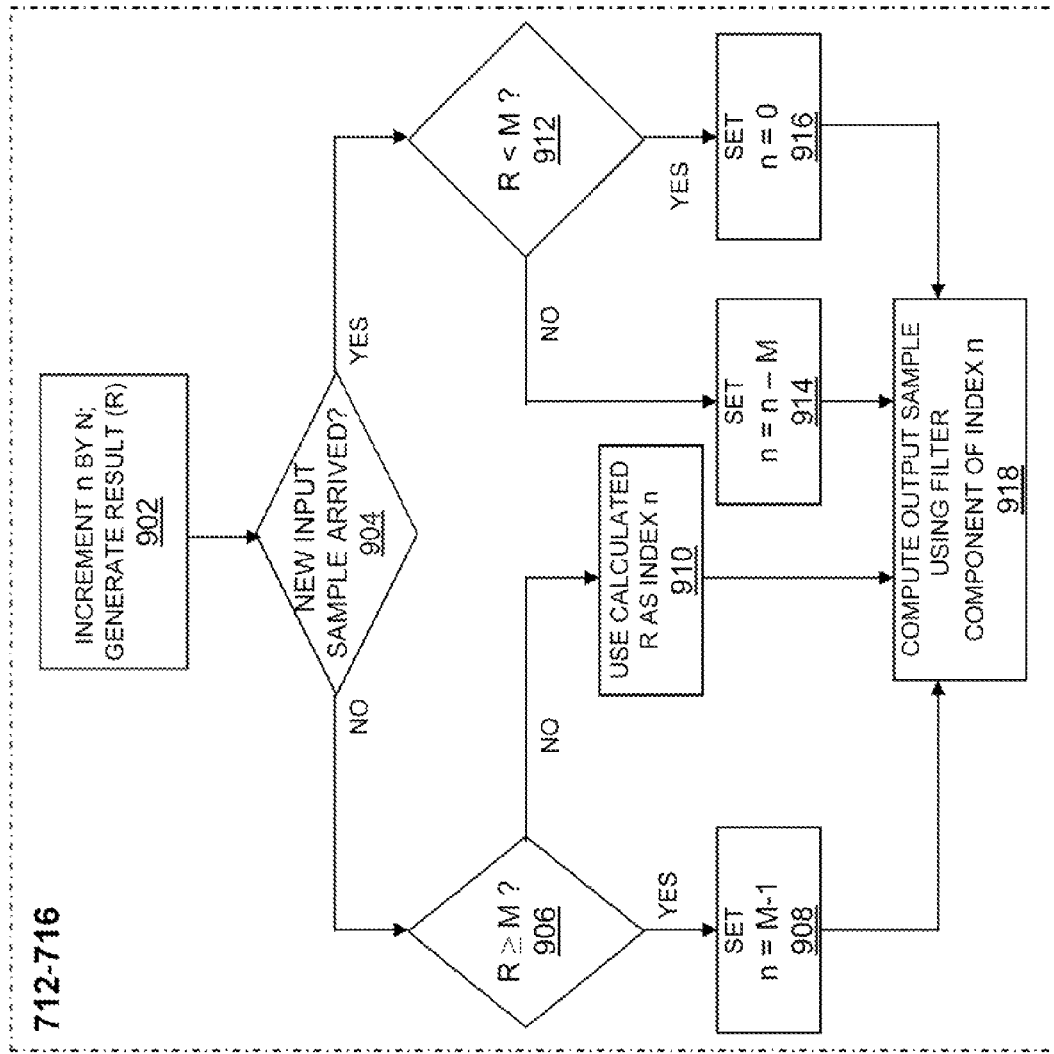

SELF-CORRECTING MULTIRATE FILTER

BACKGROUND

1. Technical Field

The present disclosure relates in general to signal processing and in particular to signal processing utilizing a programmable multirate filter.

2. Description of the Related Art

There has been a dramatic increase in multi-mode use in cellular radio devices, or cell phones as they are conventionally known. This fact coupled with the availability of both multiple bandwidth options for a given radio access technology (RAT) and RAT combinations from $3^{RD}$ Generation Partnership Project (3GPP) & 3GPP2 standards has increased the importance of sample rate conversion. This increased importance is especially pronounced for cellular modems.

There are multiple standards and technologies supported by common RF components. In order to reduce power and area requirements on the chips, it has become increasingly desirable to utilize common baseband sampling rate to address multiple technologies. This implementation can involve the use of multirate filters. To achieve accurate timing, delay through multirate filters must be deterministic. However, providing deterministic delays can be difficult due to crossing clock domains and unknown clock phase relationships. Also, it is not practical to use lowest common sampling frequency to hit exact timing corrections. For example, achieving ¼ chip adjustments for cell division multiple access (CDMA) using long term evolution (LTE) 1.92 MHz sampling rate would require upsampling and filtering of data at 100× (122.88 MHz). Also, uplink timing synchronization is critical for uplink performance. There is currently no efficient method to sample signals that properly accounts for a diverse set of signal frequencies and phase relationships and which can also account for jitters inherent in the input and/or output clocks of a multirate filter.

BRIEF DESCRIPTION OF THE DRAWINGS

The described embodiments are to be read in conjunction with the accompanying drawings, wherein:

FIG. 5 illustrates an example quantized coefficient index mapping table pre-generated and utilized during real-time signal sampling at the signal processing system, according to one embodiment;

FIG. 8 is a flow chart illustrating a method for triggering re-initialization and/or self-correction of the real time configurable multirate filter, according to another embodiment;

FIG. 9A is a flow chart illustrating a method for updating the index value of the multirate filter, based on arrival and/or non-arrival of a new input sample, in accordance with one or more embodiments; and FIG. 9B is a flow chart illustrating another method for updating the index value of the multirate filter, in accordance with one embodiment.

DETAILED DESCRIPTION

Figure 1:
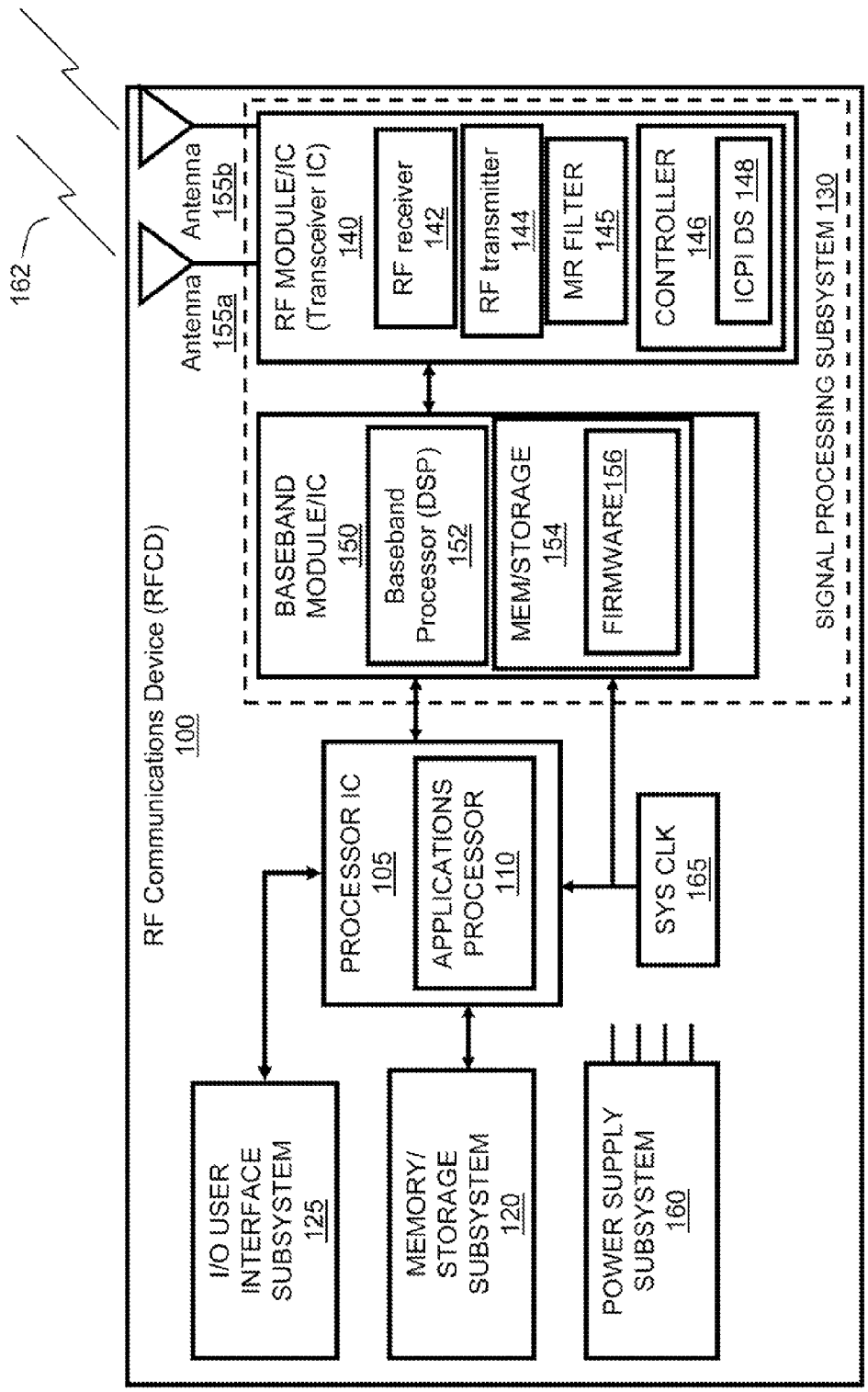
FIG. 1 is a block diagram illustrating an example radio frequency (RF) communication device within which the various features of the described embodiments can be advantageously implemented, according to one embodiment.

The illustrative embodiments provide a method and system for implementing a real-time configurable, self-correcting multirate filter that provides real-time sample rate conversion. The multirate filter supports the tight timing constraints required by cellular standards on both the uplink and downlink.

In a first embodiment, the method includes: in response to detecting a data stream at an input of the multirate filter, measuring a current phase relationship between a current resampling filter input clock signal and a current multirate output clock signal; and identifying an initial polyphase filter coefficient index corresponding to the measured phase relationship using a mapping of the measured phase relationship within a pre-generated quantized mapping table. The pre-generated quantized mapping table includes an association of each of a plurality of sets of different values of measured phase relationships with one initial polyphase filter coefficient index that identifies a particular polyphase filter component of the multirate filter. The multirate filter is made up of a plurality of polyphase filter components each uniquely identified by a different polyphase filter coefficient index and each capable of being individually selected to generate a different output data sample from processing received data. The method further includes: selecting a corresponding polyphase filter component from within the multirate filter using the initial polyphase filter coefficient index identified; configuring the multirate filter to pass data from the data stream through the corresponding polyphase filter component; and in response to a request for generation of a next output data sample, updating the initial polyphase filter coefficient index to a calculated next polyphase filter coefficient index value. The corresponding polyphase filter component selected generates an initial output data sample from data of the data stream inputted to the multirate filter, and the initial output data sample is derived utilizing sampling functions specific to that corresponding polyphase filter component.

In one embodiment, the method function of dynamically measuring a phase relationship comprises measuring a time interval between a first rising edge of the resampling filter input clock signal and a first rising edge of the multirate output clock signal using a measuring clock signal that is faster than both the resampling filter input clock signal and the multirate output clock signal. The time interval is measured in units of full signal counts of the measuring clock signal. Also, a total number of the full signal counts of the measuring clock within the time interval is mapped within the pre-generated quantized mapping table to one initial polyphase filter coefficient index, and each polyphase filter coefficient index is uniquely mapped to a set of one or more different numbers of signal counts of the faster measuring clock signal.

In yet another embodiment, the method includes self-correcting the multirate filter by adjusting the next polyphase filter coefficient index value to a new polyphase filter coefficient index value within a pre-set range of acceptable polyphase filter coefficient index values. The self correcting functions are initiated in response to detecting an occurrence of at least one pre-identified trigger condition that indicates at least one of (a) a change in the phase relationship between the resampling filter input clock signal and the multirate filter output clock signal and (b) an error resulting from one of the initial polyphase coefficient index selected and the next polyphase filter coefficient index value calculated. The various aspects of the method are described below with reference to the figures and in particular with reference to the flow charts of FIGS. 6-9.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof.

Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment.

Figure 2:
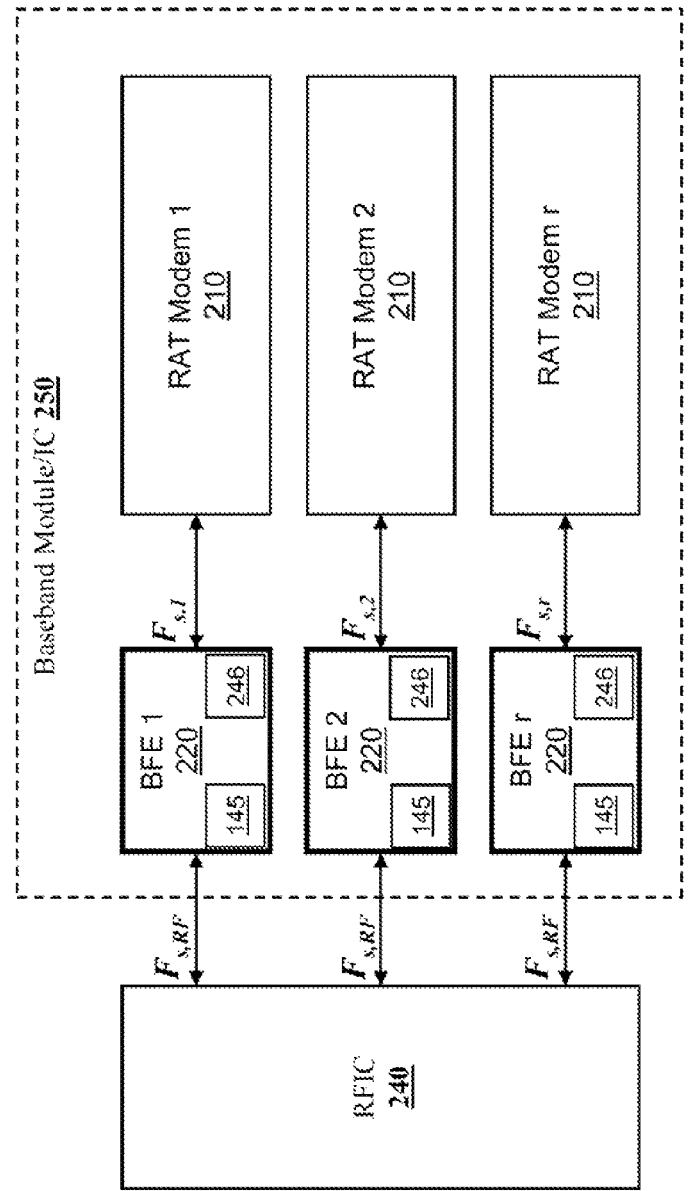
FIG. 2 provides a block diagram representation of a signal processing system having a multi-modem baseband module and RF integrated circuit (IC) within which the various aspects of a real-time configurable, self-correcting multirate filter can be implemented, according to one embodiment.
Figure 3:
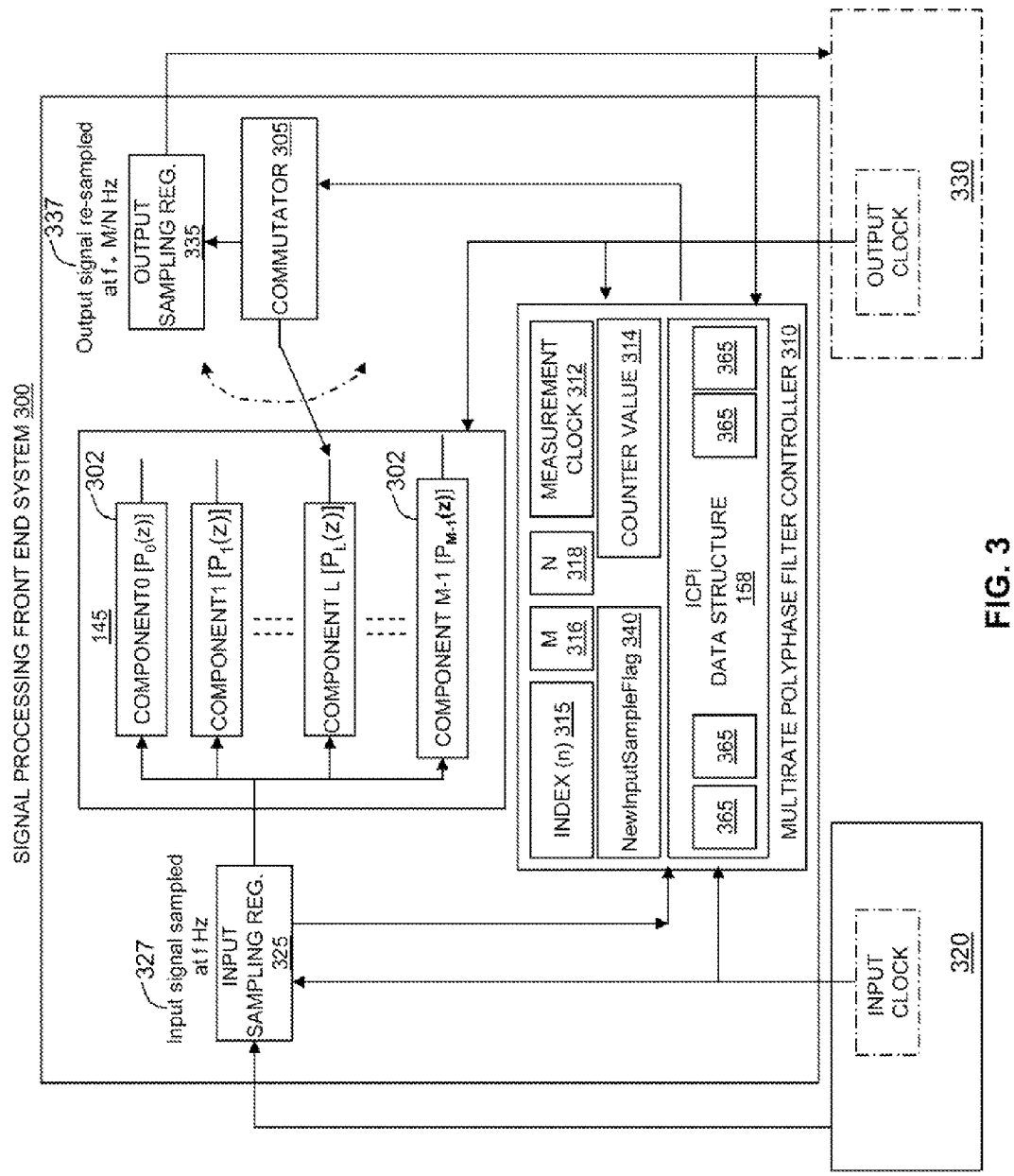
FIG. 3 illustrates a functional block diagram of an example signal processing system having a multirate filter and other associated functional components that collectively enable implementation of the real-time configuring and self correction of the multirate filter during input and/or output signal processing, according to one or more embodiments.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized. Within one or more embodiments of the disclosure, the following variables terms are presented and utilized with specific functionality and are defined as follows:

M: Upsampling factor, which is equal to the number of polyphase components.
N: Downsampling factor.
$f_i$: Resampling filter input clock frequency.
$f_O$: Resampling filter output clock frequency, equals to $f_i *M/N$.
$f_m$: Measurement clock frequency.
n: Initial and calculated polyphase component index, utilized to compute next output
L: Order of each polyphase component
$P_n(z)$, $p_n(k)$: Transfer function and impulse response of polyphase component n, $0 \leq n < M, 0 \leq k < L$ newInputSampleFlag: a register that is set when a new input sample is detected and reset after computing each output sample.
$F_{s,r}$: Sampling frequency for Radio Access Technology (RAT) #r
$F_{s,RF}$: Common sampling frequency for RFIC As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components. In one embodiment, specifically FIG. 1, these components are illustrated within an RF communications device (RFCD) architecture, while other embodiments, specifically FIGS. 2 and 3, provide components of a generic signal processing front end system. It is however to be expressly understood that the various described aspects of the disclosure can be implemented within any of a number of different types of signal processing devices and/or structures and/or systems, including but not limited to wireless communication devices having wireless transceivers, various types of instrumentation and audio equipment, including software implementation of such devices and equipment, and in any application involving sampling rate conversion where a multirate filter can be utilized. Thus, while specific examples of devices and components are shown for illustration and to provide a structure for explaining the disclosure, the functionality presented by the described embodiments are also applicable to other digital signal processing circuits using resampling filters, for example A/D converters, digital oscilloscopes, audio equipment, and other devices, and software defined radio, which also must be able to process various communication standards operating at different baseband clock rates. Also, the resampling filter described in this disclosure can be advantageously utilized in any wireless communication device having a common RF filter with multiple wireless standards requiring different baseband clock frequencies.

Referring now to FIG. 1, there is illustrated a block diagram representation of an example RFCD 100 within which the various features of the described embodiments can be advantageously implemented, according to one embodiment. RFCD 100 represents a device that is adapted to transmit and receive electromagnetic signals over an air interface via uplink and/or downlink channels between the RFCD 100 and communication network equipment (not shown) utilizing a plurality of different communication standards, having different signal frequency components. RFCD 100 can represent a cellular telephone, a radio, a personal data assistant (PDA), a computer (e.g., a tablet, laptop, notebook, desktop, or other type of computer), and/or another device that is adapted to transmit electromagnetic signals over an air interface.

RFCD 100 includes processor integrated circuit (IC) 105, which includes an applications processor 110. Processor IC 105 is communicatively connected via a system interconnect fabric to a plurality of other components of RFCD 100, including combined memory and storage 120, input/output user interface subsystem 125 and power supply subsystem 160. Power supply subsystem 160 can include, for example, an interface to line power and/or a battery power system. Also illustrated within RFCD 100 is system clock 165, which can be one of any number of different types of timing mechanisms that are utilized by electronic devices. In one embodiment, multiple different clocks can be provided. Also, in one or more embodiments, system clock 165 can be divided down or multiplied to generate different clock frequencies as required during operation of the various RFCD functions.

RFCD 100 also includes signal processing subsystem 130. As illustrated, signal processing subsystem 130 generally includes RF module 140 and baseband module 150, although it is appreciated that additional functional components can be present within signal processing subsystem 130. In one or more embodiments, RF module 140 can be an RFIC and can be referred to as such. RF module 140 includes RF receiver 142 and RF transmitter 144. In the example of FIG. 1, RF receiver 142 and RF transmitter 144 are illustrated as individual component blocks; however, alternate embodiments can provide a combined RF transceiver component, which supports the functionality of both the receiver side and transmitter side of signal communication for RFCD 100. In the particular embodiment of FIG. 1, RF module 140 also includes real-time configurable, self-correcting multirate filter 145, which is hereinafter referred to simply as multirate filter 145, and RF module further includes multirate filter controller 146 or MR controller 146. In one implementation, MR controller 146 is a combination of firmware and logic that collective controls the various filter configuration and signal sampling aspects of the disclosure. Provided with or within MR controller 146 is an initial coefficient polyphase index (ICPI) data structure 148. As described in greater detail with respect to FIG. 5, ICPI data structure 148 includes one or more pre-generated tables providing an association and/or a mapping of coefficients indices to measurement counter values for a particular combination of input and output clock frequencies using a specific measurement clock. It is to be understood that multirate filter 145 can be located in a different area within signal processing subsystem 130 and specifically can be located off the RF module, in alternate embodiments. FIG. 2, described hereafter, provides one such alternate embodiment. Coupled to RF module 140 are two antennas 155a, 155b which enables the over the air transmit and receive interfacing functions of RFCD 100. The over the air interface is generally represented with two signal lines 162 representing an uplink for outgoing signals and a downlink for incoming signals.

Baseband module 150 comprises a baseband processor 152, which can be described as a digital signal processor (DSP), and a memory or storage system 154. According to one aspect of the disclosure, memory/storage system 154 includes therein firmware 156 that supports the various processing functions of baseband module 150. In one or more alternate embodiments, such as illustrated by FIGS. 2 and 3, in which the MR filter is located on baseband module 150, firmware 156 can include multirate filter controller (MFC) firmware 156, including a similar ICPI data structure as provided within RF module 140. However, it is appreciated that other types of firmware can be provided within baseband module 150 to support other operations of baseband module 150 that may not be related to or associated with controlling the multirate filter.

The various components within RFCD 100 can be electrically and/or communicatively coupled together as illustrated in FIG. 1. As utilized herein, the term "communicatively coupled" means that information signals are transmissible through various interconnections between the components. The interconnections between the components can be direct interconnections that include conductive transmission media, or may be indirect interconnections that include one or more intermediate electrical components. Although certain direct interconnections are illustrated in FIG. 1, it is to be understood that more, fewer or different interconnections may be present in other embodiments.

In one embodiment, applications processor 110 is adapted to perform various functions, including generating data and/or other information that is to be communicated from RFCD 100 out to the air interface. I/O user interface subsystem 125 can also comprise audio input components, such as a microphone, and/or data input components, such as a keyboard, keypad, and tactile or touch screen input device, and/or multimedia input components, such as a camera. These various input components can then provide voice and/or data that can also be processed for transmission as outgoing communication signals from RFCD 100 utilizing baseband module 150, RF transmitter 144 and antennas 155. In order to enable transmission of this information from RFCD 100, baseband module 150 of signal processing subsystem 130 generates outgoing digital signals for transmission by RF transmitter 144. Inversely, RFCD 100 can receive incoming signals from the air interface for eventual output on or at one or more output components of RFCD 100, or for utilization by applications processor 110, or for storage within memory/storage subsystem 120. These incoming signals are received at RF receiver 142 via antennas 155 and processed by baseband module 150 to generate received data that can be utilized within RFCD 100. According to one or more aspects of the disclosure, both the incoming and outgoing signals undergo filtering as input signals that are passed through multirate filter 145 in order to generate an appropriate filter output sample at an appropriate output frequency.

Thus, as provided by the embodiment of FIG. 1, with multirate filter embedded on RFIC 140, RFIC 140 is adapted to receive incoming RF signals from antenna 155 and to perform down-conversion, filtering, and analog-to-digital conversion, among other functions, on the incoming RF signals in order to generate incoming digital signals, which may be processed by baseband processor 152 and/or applications processor 110. Likewise, RFIC 140 is adapted to receive outgoing digital signals generated by applications processor 110 and/or baseband processor 152 and to perform filtering, digital-to-analog conversion, upconversion, gain adjustment, and amplification, among other functions, to the outgoing digital signals in order to generate outgoing RF signals, which are transmitted over the air interface 162 by antenna 155.

As introduced, aspects of the disclosure are related to processing of incoming and outgoing signals within RFCD 100, while supporting multiple different standards and communication technologies utilizing common RF components to reduce power and area requirements within RFCD 100. Thus, aspects of the disclosure are directed towards providing a solution to and addresses multi-modem problem faced by RF communications industry as vendors re-use RF components for multiple access technologies (e.g., LTE, CDMA, TD-SCDMA, etc.). Further, aspects of the disclosure provides a solution to evolving communications paradigm where the number of modes are expanding (e.g., LTE has 6 or more channel bandwidths) and there is an increased mixing of radio access technologies (RATs) across standard bodies (e.g., CDMA working with LTE). Additionally, aspects of the disclosure are directed towards allowing the single common components to provide both uplink timing synchronization as well as downlink timing synchronization given the different frequencies utilized for signal transmission across the various communication technologies, such as, for example:

1. Provide time advance or retard/delay at ¼ chip resolution at 1.2288 MHz chip rate—for CDMA 1× RTT and EvDO (essentially 4.9152 MHz)
2. Provide time advance or retard/delay at ⅛ chip resolution at 1.28 MHz chip rate—for TD-SCDMA (essentially 10.24 MHz)
3. Provide time advance or retard/delay at 16 sample resolution at 30.72 MHz sampling rate—for LTE (essentially 1.92 MHz)

With the above multi-mode and inter-RAT communication scenarios, the described embodiments provide one or more methods that enable a signal processing system, such as RFCD 100, to achieve accurate timing, by providing deterministic delay through multirate filter 145 across different clock domains with clock phase relationships that are unknown prior to processing of the input signal. Thus, in FIG. 1, multirate filter 145 is included within RF module 140 in order for RFCD 100 to utilize a common baseband sampling rate to address multiple technologies. One aspect of the disclosure involves filter initialization processing in order to properly configure the multirate filter 145. In the embodiment presented by FIG. 1, this filter initialization processing and/or filter configuration process can be implemented within baseband module 150 and specifically by baseband processor 152 of baseband module 150. Specifically, in one embodiment, additional aspects of the described embodiments can be provided by control logic generated by execution on baseband processor 152 of multirate filter control (MFC) firmware 156 (FIG. 1). When provided via executable code, the control logic can be executed by baseband processor 152 to perform a sequence of functions including, for example, performing real-time clock measurement and quantized mapping table look-up and selection from data structure 148 among other functions as illustrated by the flow charts which are described below.

FIG. 2 illustrates one embodiment in which the control logic provided by baseband processor 152 can actually be implemented utilizing a plurality of baseband processing engines. It is to be appreciated that these processing engines can themselves be individual allocations of baseband processor 152 executing firmware code provided by MFC firmware 156 of baseband module 150. FIG. 2 generally provides a block diagram representation of a signal processing system 200, which can form substantially all of or a portion of a variety of different types of signal processing apparatus, e.g., RFCD 100. Signal processing system 200 generally includes a multi-modem baseband module 250 and RF integrated circuit (IC) 240. Within baseband module 250 are a plurality of signal processing components, referred to as Baseband Front Ends (BFEs) 220. In the present embodiment, BFEs 220 include multirate filter 145 as well as the processing logic required to perform the various functions involving multirate filter 145, i.e., MR controller 246, as described herein. As shown, baseband module 250 includes three RAT modems 210, which can each be assigned to modulate and/or demodulate a different sampling signal frequency, represented as $F_{s,r}$, where r is identifier of a particular RAT. Each modem 210 is shown communicatively coupled to a respective BFE 220, which is in turn communicatively coupled to RFIC 240. For purposes of the described embodiments, the majority of the processing occurring before sampling via multirate filter 145 of an outgoing or incoming signal is completed by a respective BFE 220. With the descriptions of the various embodiments presented herein, each first signal at the right of BFE 220 is assume to have a signal frequency associated with the signal clock of baseband module 250. This signal clock frequency is either the input or the output signal clock frequency of the multirate filter depending on whether the signal being processed is an incoming signal or an outgoing signal. Conversely, each second signal at the left of BFE 220 is assumed to have a sampling frequency associated with the signal clock of the RFIC 240. The sampling clock frequency associated with the RFIC 240 is labeled as $F_{s,RF}$. The first and second signals thus each represent one of the input and the output clock signals of the multirate filter, depending on whether the multirate filter is processing an outgoing signal or an incoming signal relative to the expanded device or system.

FIG. 3 illustrates a functional block diagram of one implementation of a signal processing transceiver front end system 300 having a polyphase multirate filter and other associated functional components or logic that collectively enable implementation of (1) real-time measurement of phase relationships between input and output signals, (2) real-time configuration of the multirate filter, and (3) real-time self correction and/or re-initialization of the multirate filter 145 during input and/or output signal processing, according to one or more embodiments. For simplicity, the signal processing front end system 300 shall hereafter by referenced by the acronym SPFES 300. SPFES 300 can be utilized within any communication device, such as RFCD 100, for example, that enables communication of a stream of data signals. SPFES 300 can include functional components of baseband module 150/250 and RFIC 140/240 of FIGS. 1 and 2, which components collectively enable (1) application of a specific initial index to select a corresponding component of the multirate filter 145, (2) real-time updating of the index of the multirate filter 145 to a next index, and (3) subsequent real-time correction of the next index to a new index in response to one or more pre-identified trigger conditions.

SPFES 300 includes polyphase multirate filter 145 having a plurality of individually selectable polyphase filter components 302 and an associated commutator 305. SPFES 300 also includes a multirate polyphase filter controller 310. Each of the plurality of polyphase filter components 302 are uniquely identified by a different polyphase filter coefficient index, indicated as 0 through M-1, and each filter component 302 is capable of being individually selected by commutator 305 to generate a different output data sample by processing data received from input signal 327. SPFES 300 communicates transmitted or outgoing signals and communicates received or incoming signals after sampling data from the outgoing or incoming signal utilizing multirate filter 145. As shown, each component 302 of multirate filter 145 provides a different function ($P_N(z)$) for sampling an input data. Input data is retrieved from input signal 327 which is received at input sampling register 325. According to the illustrative embodiment, the input signal 327 to the multirate filter 145 has sampling frequency of f Hz based on an input clock 320 associated with a first device or component from which input signal 327 is sent to multirate filter 145. Multirate filter 145 generates output signal 337 which is passed through output sampling register 335. Output signal 337 is re-sampled at a frequency of f*M/N Hz, where M is the upsampling factor that is equal to the total number of polyphase components 302 and N is the downsampling factor. The output signal 337 has a frequency component associated with output clock 330 which can be associated with a second device or component to which the output signal 337 is forwarded.

When applied to RFCD 100 of FIG. 1 or signal processing system 200 of FIG. 2, the input clock 320 can be either (a) the RF signal clock at RFIC 140/240 for incoming signals received at RFCD 100/SPS 200 or (b) the modem clock of the baseband 150/250 for outgoing signals to be transmitted from RFCD 100/SPS 200. The output clock is then the clock of the other component that does not provide the input clock. Generally, the input clock is referred to herein as the multirate or resampling filter input clock signal and the output clock is referred to as the multirate filter output clock signal.

According to one aspect of the disclosure, input sampling register 325 and output sampling register 335 are temporary pass-through locations at which receipt of the input signals and the output signals are respectively detected. When a new or next input signal is detected at input sampling register 325, a signal is communicated to controller 310, and controller 310 sets NewInputSampleFlag 340. Then, when an output signal is detected at output sampling register 335, a second signal is communicated to controller 310, and controller 310 resets NewInputSampleFlag 340. It is important to note that the sampling registers are not similar to conventional data buffers and do not provide any memory storage for data. In one embodiment, these sampling registers are utilized simply as pass through components to identify the present of a new input data and the generation of the corresponding output data sample.

Multirate polyphase filter controller 310, or simply controller 310, performs a plurality of the functions described herein outside of the actual sampling of the input data. As shown, controller 310 includes a measurement clock 312, measurement counter value 314, Index (n) 315, upsampling factor M 316, downsampling factor N 318, and NewInputSampleFlag 340. Controller 310 also includes ICPI data structure 158, which further includes a plurality of quantized mapping tables 365. One or more of the listed variables within controller 310, e.g., Index (n) 315, upsampling factor M 316, downsampling factor N 318, and NewInputSampleFlag 340, can be stored within a register within controller 310.

Controller 310 receives an input of input clock signal 320 and output clock signal 330. These clock signals are then measured with the measurement clock 312 to enable controller 310 to configure the multirate filter to properly process the input signals 327, based on a result of the measurements. According to one embodiment, in addition to being utilized to determine the coefficient index, the measurement clock 312 can also be utilized to determine both the upsampling factor, M, as well as the downsampling factor N by measuring the number of measurement clock cycles within one signal component. The upsampling factor determined is then utilized to configure the number of components for the associated multirate filter. The downsampling factor N is then utilizes as the factor by which the index, n, is incremented and/or updated, as described hereafter. As shown by FIG. 3, the output signal sample generated with the specific multirate filter components selected is equal to a ratio of the input and output signals by a factor of M/N.

Figure 6:
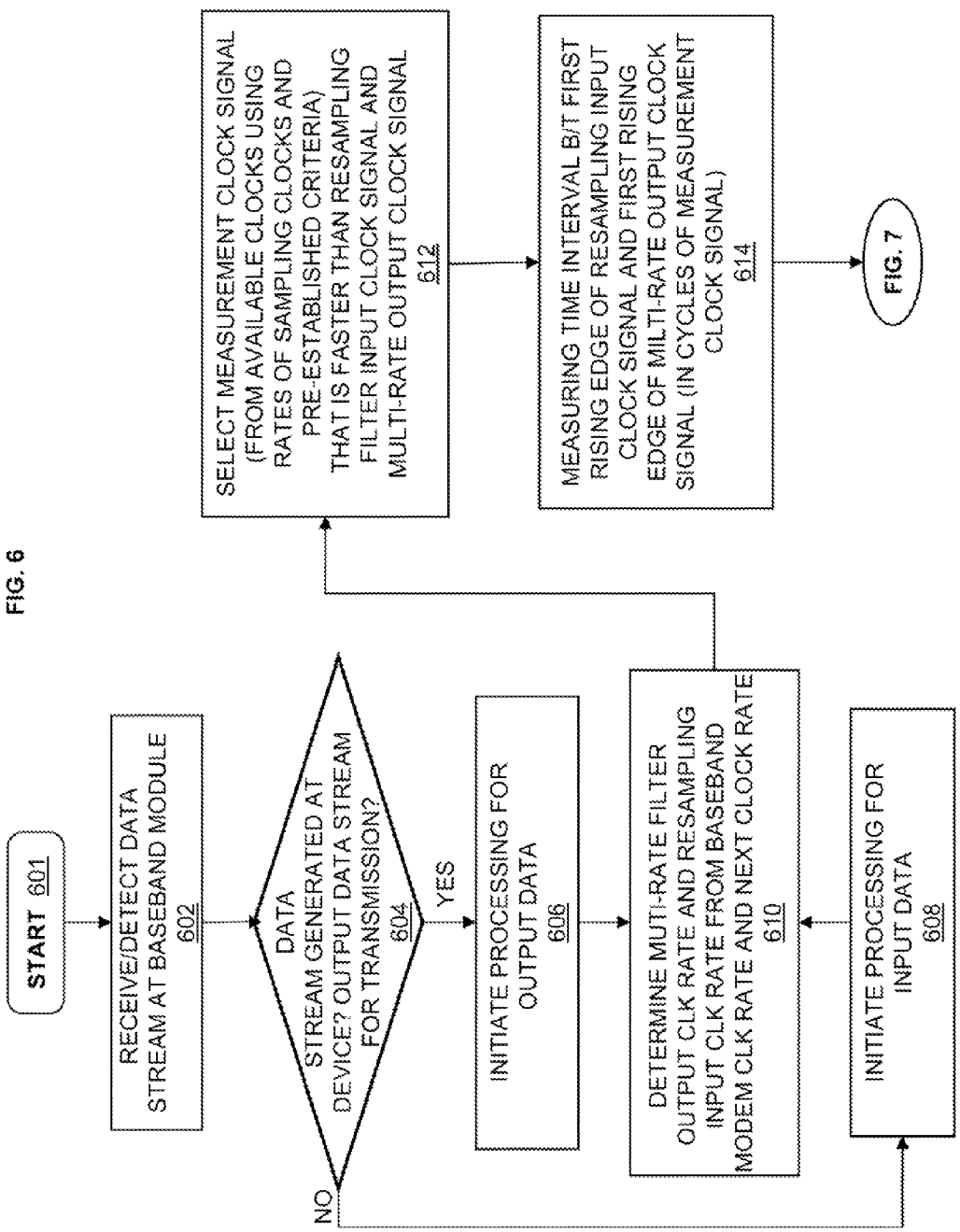
FIG. 6 is a flow chart illustrating one embodiment of a method for implementing re-sampling, real-time configuration of a multirate filter based on a measured phase difference between input and output signal clock frequencies, according to one or more of the embodiments.

Following the filter initialization processing to configure the multirate filter, as provided by FIG. 6, described hereafter, controller 310 triggers commutator 305 to select a specific one of the components 302 based on a current value of the Index (n) 315. As described herein, index n 315 represents a polyphase coefficient index whose value is initially determined by the sequence of processes described hereafter. The value of index n 315 represents the index corresponding to a component 302 of multirate filter 145 that will be utilized to process a next output sample from the input signal 327. The value of index n 315 can change, i.e., be recalculated, for each new output sample being processed through mutirate filter 145. In one embodiment, controller 310 can be a function provided by MFC firmware code 156 (FIG. 1) exclusively within baseband module 150 or partially implemented within baseband 150 and RFIC 140.

Those of ordinary skill in the art will appreciate that the hardware components and basic configurations depicted in FIGS. 1, 2, and 3 may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention.

Figure 4A:
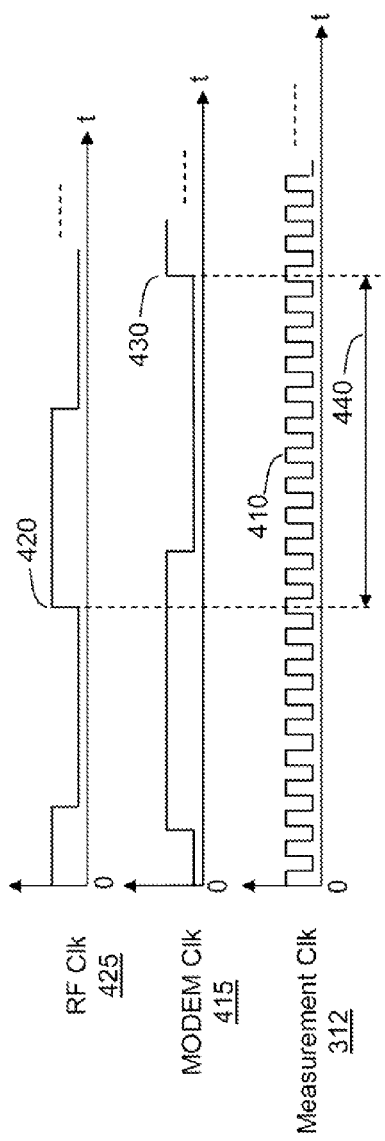
FIGS. 4A and 4B are timing diagram illustrating a measurement, utilizing a faster measurement clock, of a timing interval between the rising edges of an input clock signal and an output clock signal utilized to determine an initial index for the multirate filter, according to one or more embodiments.
Figure 4B:
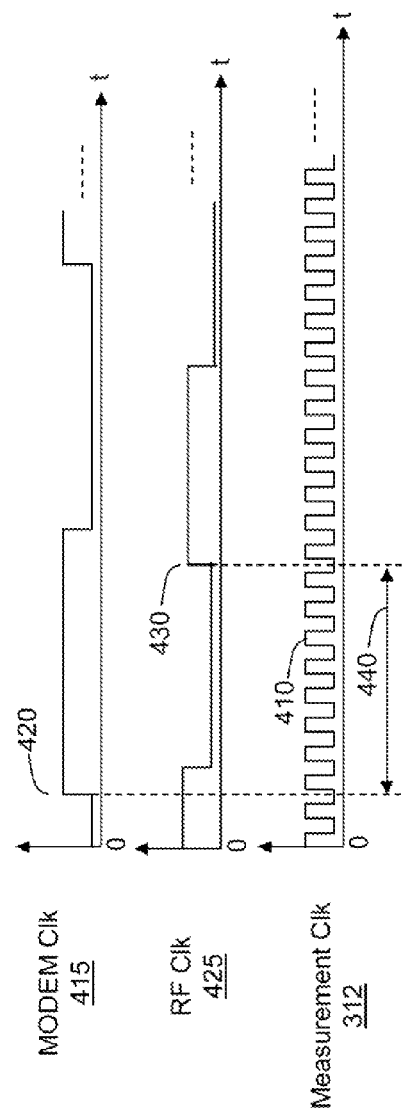

According to one aspect of the disclosure, the polyphase filter component 302 that is selected to sample the input signal 327 at an initial time (t0) and to generate the corresponding sample output signal 337 is determined from an analysis performed by controller 310 utilizing the input clock signal (320), the output clock signal (330), and a measuring clock signal (312). Aspects of this analysis are now described with reference to FIGS. 4A-4B and FIG. 5. FIGS. 4A and 4B are timing diagrams illustrating a relative measurement of a phase difference or timing interval between an input clock signal and an output clock signal utilizing a faster measurement clock, e.g., measurement clock 312 (FIG. 3). Specifically, measurement clock 312 is utilized to count, in measurement clock cycles 410, a timing interval 440 between the rising edge 420 of an input clock signal and the rising edge 430 of an output clock signal. As shown, each clock signal is represented on a horizontal axis, which corresponds to a time beginning at time 0 up to time t. Each clock signal also has a corresponding amplitude represented on the vertical axis. It is understood that the measurement value that results from the use of a measurement clock to measure the phase difference between rising edges of both filter input and filter output clocks can yield only an approximate value. For example, the number of measurement clock signals can likely be not an integer value, with a plus variance up to a next whole clock cycle or a minus variance down to a next whole clock cycle. According to one aspect of the disclosure, the non-integer measurement clock value is normalized up or down to a whole integer to yield a whole number approximation. The whole number approximation is then utilized to select the initial coefficient index, and any measurement errors inherent from the utilization of an approximation can then be corrected via the error-correction procedure described hereinafter and illustrated by several of the flow charts. It is further appreciated that the application of error-correction can account for an approximation that is several measurement cycles off rather than simply a fractional part of a measurement cycle. Once the measurement value of the phase difference or time interval between rising edges is completed and normalized (i.e. rounded up or down to an integer), the resulting number of measurement clock cycles 410 is then compared against measurement counter values 505 (FIG. 5) within a pre-generated coefficient index lookup table 500 (FIG. 5) to determine a corresponding initial coefficient index 510 (FIG. 5) utilized to select an initial component 302 of the multirate filter 145. As indicated by FIG. 4A and FIG. 4B, the clock that is utilized as the input clock can be the RF clock 425 when processing incoming signals (FIG. 4A) or the Baseband Modem Clock 415 when processing outgoing signals (FIG. 4B). The clock that is not the input clock signal then provides the output clock signal for utilization in the measurements illustrated by FIGS. 4A-4B.

FIG. 5 illustrates an example quantized mapping table 500, which is a coefficient index lookup table maintained within ICPI data structure 158 (FIG. 1). Quantized mapping table 500 is pre-generated by performing a sequence of measurements and mathematical extrapolations involving a range of multiple different phases across a single set of input-output clocks. According to one embodiment, the quantized mapping tables (500) are generated based on an analysis of the multirate filter operations for different clock frequencies supported by the device. The behavior of the multirate filter is analyzed utilizing similar input-output-measurement clock signals as those available within the front end to be applied to when analyzing a received signal stream that is going to being sampled. This analysis of the multirate filter behavior with consideration of the supported frequencies of the device(s) yields the resulting pre-generated quantized mapping table for the specific combination of input-output-measurement clock signals. The tables are stored within data structure 158 indentified by that particular combination of input-output-measurement clock signals. Notably, these sets of clock signals represent specific clock signal frequencies that can be supported by the communication device and/or the front end components within which the firmware required to perform the various functions of the disclosure are provided.

FIGS. 4A-4B illustrate a single measurement involving sample set 520 of input-output-measurement clocks including input clock frequency, output clock frequency, and measurement clock frequency. This set of clock frequencies represent one set that can be expected to require processing by SPFES 300 as a stand alone system or within a BFE 220 (FIG. 2) and/or an RFCD 100 (FIG. 1). Thus, data structure 158 can include a plurality of different coefficient index lookup tables (such as quantized mapping table 500) corresponding to different sets of input-output-measurement clock signal data. For existing and/or legacy devices, data structure 158 including a full complement of quantized mapping tables (500) can be provided as a firmware upgrade, in one embodiment.

As an example of the manner in which the pre-generated quantized mapping table 500 can be utilized with the measurement counter to identify the initial polyphase coefficient index, reference is made to FIGS. 4A and 5. First, within FIG. 4A, the measurement of the time interval between the rising edge of the input clock, presented as RF clock 425, and the rising edge of the output clock, presented as baseband modem clock 415 in measurement clock cycles equals 11 clock cycles (~10.82 normalized to 11). This value of 11 is then utilized as the estimated measurement counter value, which is mapped to a same value within the pre-generated quantized mapping table 500. Thus, from table 500, controller 310 can mapped the currently measured time value of 11 clock cycles to the fifth measurement counter entry with corresponding index of 4. As another example, if the measured time interval from FIG. 4A is either 20 or 21 clock cycles, then the selected polyphase coefficient index would be 8, and so on.

The various functions performed by execution of controller 310 are illustrated by the methods of FIGS. 6-9, which are described hereafter with reference to the example components of FIGS. 1-5. FIG. 6 is a flow chart illustrating one embodiment of a method for implementing real-time multirate signal sampling utilizing components of the example device and systems FIGS. 1-3, with the example measurements illustrated by FIGS. 4-5, according to one or more of the embodiments. For simplicity, all functions shall be described as being performed by controller 310, without limiting the disclosure to other configurations, such as presented in FIG. 1 (e.g., baseband processor 152 to execute code of MFC firmware 156). According to the embodiment illustrated by FIG. 6, responsive to detecting an incoming or an outgoing data stream, controller 310 performs the below sequence of method functions. In one or more alternate embodiments, the activation trigger that initiates the phase measurement and coefficient index initialization processes can be one of: (a) activation of baseband data; (b) receipt of a request to advance or a request to retard or delay uplink data by a specified amount; and (c) support of independent delays in the I or Q component of the baseband data, for example, to support Offset QPSK.

Method 600 begins at block 601 and proceeds to block 602 at which controller 310 receives and/or detects a data signal stream. Because the processing performed by the method can be for both incoming signals as well as outgoing signals, method 600 can include a determination at block 604 whether the data stream was generated as an outgoing data transmission stream. In response to the data stream being an outgoing data transmission stream, controller 310 biases the pending filter input-output phase measurements to initiate processing for outgoing data (block 606). Otherwise, controller 310 biases the measurements to initiate processing for input data (block 608). Method 600 then includes controller 310 determining which clock signal, relative to processing of outgoing data versus incoming data, to assign as the multirate filter output clock and which to assign as the resampling input clock (block 610). This determination can be required for only certain configurations where one of the input clock or output clock is maintained at a known constant frequency. Method 600 then includes controller 310 selecting an appropriate measurement clock signal from a set of available measurement clocks that are pre-assigned as measurement clocks for particular combinations of input and output clock frequencies (block 612). The selected measurement clock is one that is faster than both the resampling filter input clock signal and the multirate output clock signal. Method 600 then includes the controller 310 measuring a time interval between a first rising edge of the identified resampling input clock signal and a first rising edge of the multirate output clock signal, in cycles of measurement clock signal (block 614). With the relative time interval or phase difference established and the information identifying the input-output-measurement clocks combination set, controller 310 can then execute the method of FIG. 7 to select an initial index and activate the multirate filter to generate appropriate output samples. In one embodiment, controller 310 can also configure multirate filter to provide M filter components based on a measurement of the input clock signal with the faster clock to determine the upsampling factor M 316. Similarly, controller 310 can set the downsample factor N 318 within the appropriate register of controller 310.

With method 600, when the data stream is an outgoing data transmission stream generated by the RFCD 100, the current resampling filter input clock signal and the current multirate output clock signal respectively represent the baseband modem clock signal and an RF sampling clock signal of the RF module. When the data stream is an incoming data stream received by the communication device, the current resampling filter input clock signal and the current multirate output clock signal respectively represent the RF sampling clock signal and the baseband modem clock signal.

Figure 7:
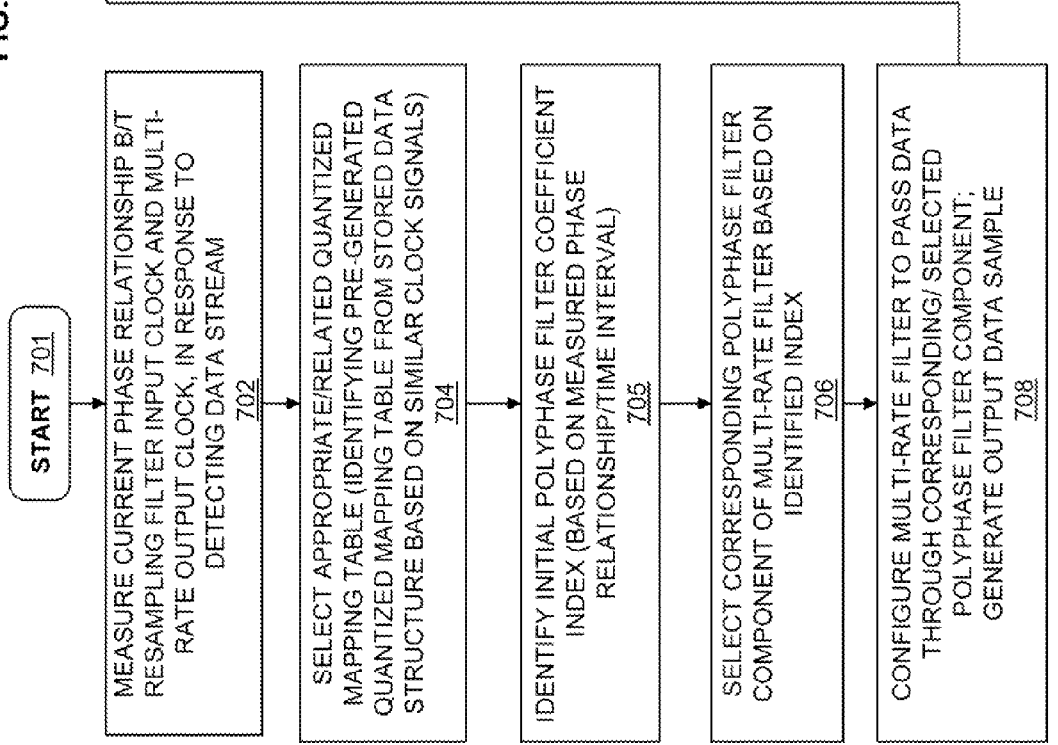
FIG. 7 is a flow chart illustrating the method for implementing real-time multirate signal sampling with self-correction of the multirate filter, according to one or more embodiments.

FIG. 7 is a flow chart illustrating the method 700 for implementing real-time multirate signal sampling with self-correction of the multirate filter, according to one or more embodiments. Method 700 begins at block 701 and proceeds to block 702 at which the controller 310 measures a current phase relationship between a current resampling filter input clock signal and a current multirate output clock signal. This measurement occurs in response to detecting the data stream according to the sequence of functions provided by FIG. 6. Method 700 then proceeds to block 704 at which controller 310 selects an appropriate quantized mapping table from data structure 158 (FIG. 1) based on similar input-output-measurement clock signals associated with the selected table. Then, controller 310 identifies, by matching the current measured phase relationship and/or time interval (i.e., the measurement counter value) within the selected pre-generated quantized mapping table, an initial polyphase filter coefficient index corresponding to the measured phase relationship (block 705). The associated initial polyphase filter coefficient index identifies a corresponding polyphase filter component of the M polyphase filter components of multirate filter 145, and the controller 310 of multirate filter 145 biases the commutator to select, based on the initial polyphase filter coefficient index identified, a corresponding polyphase filter component from within the multirate filter (block 706). In response, the mutirate filter controller 310 configures the multirate filter to pass data from the data stream through the corresponding polyphase filter component (block 708). Thus, the corresponding polyphase filter component selected generates an initial output data sample from data of the data stream inputted to the multirate filter, and the initial output data sample is derived utilizing sampling functions ($P_n(z)$) specific to that $n^{th}$ corresponding polyphase filter component, with index value n.

Following generation of the initial output sample, method 700 provides that the controller 310 detects when or determines whether a next output data sample is required (block 710). Responsive to a request or trigger for generation of a next output data sample, controller 310 triggers/initiates an update of the initial polyphase coefficient index to a calculated next filter coefficient index value (block 712). A determination is then made at block 714 whether the calculated next index is at a boundary condition and/or whether the next input data arrival time is different than the time the input data is expected to arrive and/or whether an output sample is requested at a different time than expected. Two specific boundary condition analyses are described in greater detail with reference to FIG. 9. With method 700, in response to the index being at a boundary condition, method 700 includes controller 310 performing a self-correction of the multirate filter by adjusting the next index value to within a preset allowable range of index values (block 716). Following, method 700 includes controller 310 setting the commutator 305 (FIG. 3) to select a next filter component corresponding to the corrected new index value (block 718). The selected next filter component is then utilized when computing a next output data sample (block 720). In response to the initially calculated updated next index value not being at a boundary condition (from decision block 714), the method 700 proceeds directly to block 718, where the initially calculated next index value is utilized to select the corresponding filter component to compute the next output data sample.

In one embodiment, the controller 310 self-corrects the multirate filter 145 by adjusting the next polyphase filter coefficient index value to a new polyphase filter coefficient index value within a pre-set range of acceptable polyphase filter coefficient index values in response to the trigger condition. One aspect of the triggering of the self-correction, involves the controller 310 detecting an arrival of a next data at a different time than a pre-established expected time for arrival of the next data. The next data can be either outgoing data from or incoming data to RFCD 100. Then, in response to detecting the arrival of the next data at the different time, the controller 310 determines whether the multirate filter is operating at a preset boundary condition, and controller 310 performs the adjusting of the next polyphase filter coefficient index value to the new polyphase filter coefficient index value in response to the multirate filter operating at the preset boundary condition.

As described herein, aspects of the disclosure includes the controller 310 measuring a phase relationship by measuring a time interval between a first rising edge of the resampling filter input clock signal and a first rising edge of the multirate output clock signal using a measuring clock signal that is faster than both the resampling filter input clock signal and the multirate output clock signal. The time interval is measured in units of full signal counts of the measuring clock signal. Also, a total number of the full signal counts of the measuring clock within the time interval is associated within the pre-generated quantized mapping table to one initial polyphase filter coefficient index, where each polyphase filter coefficient index is uniquely mapped to a set of one or more different numbers of signal counts of the faster measuring clock signal.

Additionally, as presented, the controller 310 selects a related quantized mapping table from among at least one quantized mapping table stored within a data structure at a storage location. The related quantized mapping table provides specific mappings of filter coefficient indices to measurement counter values generated utilizing the measuring clock to measure the time interval between a similar resampling filter input clock signal rate and a similar multirate output clock signal rate as a clock signal rate of the current resampling filter input clock signal and the current multirate output clock signal. The pre-generated quantized mapping table includes individual initial polyphase component indices each mapped to at least one measurement counter value corresponding to a number of full signal counts of the measurement clock within the measured time interval. As illustrated by FIG. 5, the pre-generated quantized mapping table comprises an association of each of a plurality of sets of different values of measured phase relationships, identified by measurement counter 505, with one initial polyphase filter coefficient index 510.

With reference now to the flow diagram of FIG. 8, there is illustrated a method 800 for triggering either (a) re-initialization of the multirate filter or (b) self-correction of the multirate filter. Method 800 can be described as a continuation of Method 700 of FIG. 7. Method 800 begins with controller 310 determining whether at least one pre-identified trigger condition is detected (block 802). When there is no detection of a pre-identified trigger condition, method 800 returns to FIG. 7 and particularly to block 702. When a pre-identified trigger condition is detected, controller 310 determines whether the pre-identified trigger condition detected is a change in the phase and/or timing relationship between the resampling filter input clock signal and the multirate output clock signal (block 804).

Specifically, the controller 310 detects at least one event that changes a timing relationship between the resampling filter input clock signal and the multirate output clock signal. According to one or more embodiments, the at least one event can include one event from among: powering up of the multirate filter; initiating the multirate filter; advancing at least one of the input data stream, the sampling clock of the data stream, and the sampling clock of the filter; retarding or delaying at least one of the input data stream, the sampling clock of the data stream, and the sampling clock of the filter; a start of I/Q data transmission; a half chip delay for QPSK; and a general timing change. Other events are contemplated and can be identified, and thus, the presented list should not be construed as being limiting on the disclosure. Notably, the arrival of the next data at a different time indicates an existence of jitter within at least one of an input and an output clock associated with the polyphase multirate filter.

Returning to block 804, in response to the pre-identified trigger condition being a detected change in the timing relationship, method 800 provides that controller 310 re-initializes the multirate filter 145 (block 810). The controller 310 then performs a new measurement of the respective clocks' timing relationship (block 812) and selects a new initial polyphase filter coefficient index from a newly selected quantized mapping table (block 814). The newly selected quantized mapping table provides associations of indices with measurement counter values derived from a measured timing relationship of a similar resampling filter input clock signal and a similar multirate output clock signal as a newly-determined current filter input clock signal and a newly-determined multirate output clock signal. Both the current measurement and the previous measurement to generate the quantized mapping table utilize a same measurement clock. If at block 804 the pre-identified trigger condition is not a change in the timing or phase relationship, a next determination is made at block 806 whether the pre-identified trigger condition is an error resulting from one of the initial polyphase coefficient index selected or the next polyphase filter coefficient index value calculated. When the pre-identified trigger condition is an error in the polyphase coefficient index value, method 800 returns control to one of block 702 or block 714 of FIG. 7. However, if the pre-identified trigger condition is not an error in the polyphase coefficient index value, method 800 ends at block 808. I FIG. 9A illustrates a method 900 by which the controller 310 triggers the multirate filter controller to self-correct the polyphase multirate filter. Specifically, FIG. 9A illustrates the method 900 for updating the index value of the multirate filter based on arrival and/or non-arrival of a new input sample, in accordance with one or more embodiments. The method begins at block 902 with controller 310: calculating a result of n+N, where n is a counter value representing an index of the commutator of the multirate filter and N is the downsampling factor corresponding to a frequency rate of the multirate output clock signal relative to the measurement clock. As previously introduced, controller 310 can increment n by N responsive to a request for a new output sample. Alternatively, the index value n can be incremented every time a new output sample is computed by multirate filter, prior to a request for a new output sample. Controller 310 checks a value of a new input sample flag or register 340 (FIG. 3) at block 904 to determine whether a new input sample has arrived. The new input data flag is automatically set at the new input data flag register (340) within controller 310 on receipt of each new input data from within the data stream, and the new input data flag (340) is cleared in response to completion of a sampling function to generate the corresponding output data sample.

In response to the new input flag indicating that no new input data has been received, method 900 includes controller 310 checking whether the newly calculated value of n, i.e., Result (R) of sum (previous n, N), is greater than or equal to M (block 906). In response to the Result of sum (previous n, N) being greater than or equal to M, controller 310 sets the new value of the index, n, to M-1 (block 908). As previously introduced, the variable M is an upsampling factor corresponding to a frequency rate of the resampling filter input clock signal relative to the measurement clock, and M represents a total number of polyphase filter components within the multirate filter. In response to determining at block 906 that Result of sum (previous n, N) is less than M while the new input flag indicates that no new input data has been received, the controller 310 applies the calculated value of n, i.e., Result of sum (previous n, N), as a next value of the index (block 910). Method 900 then includes controller 310 computing a new output sample using the filter component corresponding to index n (block 918).

Returning to decision block 904, in response to the new input sample flag indicating that new input data has been received, method 900 includes controller 310 determining whether the Result of sum (previous n, N) is less than M (block 912). In response to the Result being less than M, controller 310 sets the value of the index, n, to 0 (block 916). However, in response to the Result not being less than M (i.e., the Result is greater than or equal to M), controller 310 sets the new value of the index n to [sum (previous n, N)−M] or [Result−M] (block 914). Method then proceeds to block 918 at which controller 310 computes a new output sample using the filter component corresponding to the current value of index n (block 918).

FIG. 9B provides an alternate embodiment and/or alternate processing method for updating the coefficient index, while accounting for boundary conditions, without requiring consideration of whether a new input sample has arrived. The implementation of this alternate embodiment is reserved for situations in which the measurement clock frequency is sufficient to measure the phase difference between input and output clocks without any measurement error and when there is no jitter in the input and output clocks. For example, this alternate embodiment can be effectively utilized in a controlled environment, such as with a computer-implemented signal processing device. According to this alternate embodiment, controller 310 performs the update of the initial filter coefficient value to the next filter coefficient value by (a) adding the downsampling factor, N, to a value of a counter, n, to obtain a Result (block 920), (b) determining a modulus of the Result divided by an upsampling factor, M (block 922); and (c) applying the modulus as the new value of n, corresponding to the next filter coefficient index value (block 924). The controller 310 then selects a next polyphase filter component corresponding to the next filter coefficient index value (block 926), and the controller 310 computes a new output data sample utilizing the selected next polyphase filter component (block 928).

Thus, the above described and illustrated embodiments provide a resampling filter system and/or function that can operate with minimum delay in situations where the relationship between input and output clock phases is not known or may change over time due to clock jitter. Implementation of the above described features allows for real time evaluation of data stream in a multirate environment. One aspect of the disclosure includes providing minimal and deterministic latency through the multirate filter, as incoming data is not buffered, i.e., the data samples are processed as the samples are received. Yet another aspect includes the implementation of the method functions with no requirement for synchronization between input and output clocks, as the phase relationship is measured as an initial part of the process and the determined phase relationship then guides the processing of the data. Another aspect includes the self-correction scheme of the multirate filter to handle jitter in incoming data. The self-correcting features can be effectively applied to phase measurement errors if input or output data arrives at an unexpected time, and the adjustments are made to the filter coefficient index, only at boundary conditions.

The flowcharts and block diagrams in the various figures presented and described herein illustrate the architecture, functionality, and operation of possible implementations of systems, methods and computer program products according to various embodiments of the present disclosure. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Thus, while the method processes are described and illustrated in a particular sequence, use of a specific sequence of processes is not meant to imply any limitations on the disclosure. Changes may be made with regards to the sequence of processes without departing from the spirit or scope of the present disclosure. Use of a particular sequence is therefore, not to be taken in a limiting sense, and the scope of the present disclosure extends to the appended claims and equivalents thereof.

In some implementations, certain processes of the methods are combined, performed simultaneously or in a different order, or perhaps omitted, without deviating from the spirit and scope of the disclosure. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of implementing a multirate filter for sampling a data stream from a first clock frequency to a second clock frequency, the method comprising:
   measuring a current phase relationship between a current resampling filter input clock signal and a current multirate output clock signal;
   identifying an initial polyphase filter coefficient index corresponding to the measured phase relationship using a mapping of the measured phase relationship within a pre-generated quantized mapping table, wherein the pre-generated quantized mapping table comprises an association of each of a plurality of sets of different values of measured phase relationships with one initial polyphase filter coefficient index that identifies a particular polyphase filter component of the multirate filter, and wherein the multirate filter comprises a plurality of polyphase filter components each uniquely identified by a different polyphase filter coefficient index and each capable of being individually selected to generate a different output data sample from processing received data;
   selecting a corresponding polyphase filter component from within the multirate filter using the initial polyphase filter coefficient index identified;
   configuring the multirate filter to pass data from the data stream through the corresponding polyphase filter component, wherein the corresponding polyphase filter component selected generates an initial output data sample from data of the data stream inputted to the multirate filter, and wherein the initial output data sample is derived utilizing sampling functions specific to that corresponding polyphase filter component; and
   in response to a request for generation of a next output data sample, updating the initial polyphase filter coefficient index to a calculated next polyphase filter coefficient index value.

2. The method of claim 1, wherein:
   measuring a phase relationship comprises measuring a time interval between a first rising edge of the resampling filter input clock signal and a first rising edge of the multirate output clock signal using a measuring clock signal that is faster than both the resampling filter input clock signal and the multirate output clock signal, wherein the time interval is measured in units of full signal counts of the measuring clock signal; and
   a total number of the full signal counts of the measuring clock within the time interval is mapped within the pre-generated quantized mapping table to one initial polyphase filter coefficient index, and each polyphase filter coefficient index is uniquely mapped to a set of one or more different numbers of signal counts of the faster measuring clock signal.

3. The method of claim 2, further comprising:
   selecting a related quantized mapping table from among at least one quantized mapping table stored within a data structure at a storage location, wherein the related quantized mapping table provides specific mappings of filter coefficient indices to measurement counter values generated utilizing the measuring clock to measure the time interval between a similar resampling filter input clock signal rate and a similar multirate output clock signal rate as a clock signal rate of the current resampling filter input clock signal and the current multirate output clock signal, wherein the pre-generated quantized mapping table comprises individual initial polyphase component indices each mapped to at least one measurement counter value corresponding to a number of full signal counts of the measuring clock within the measured time interval.

4. The method of claim 1, further comprising:
self-correcting the multirate filter by adjusting the next polyphase filter coefficient index value to a new polyphase filter coefficient index value within a pre-set range of acceptable polyphase filter coefficient index values in response to detecting an occurrence of at least one pre-identified trigger condition that indicates at least one of (a) a change in the phase relationship between the resampling filter input clock signal and the multirate output clock signal and (b) an error resulting from one of the initial polyphase coefficient index selected and the next polyphase filter coefficient index value calculated.

5. The method of claim 4, wherein self-correcting the polyphase multirate filter further comprises:
detecting an arrival of a next data at a different time than a pre-established expected time for arrival of the next data, wherein said arrival of the next data at a different time indicates an existence of jitter within at least one of an input and an output clock associated with the polyphase multirate filter; and
in response to detecting the arrival of the next data at the different time, determining whether the multirate filter is operating at a preset boundary condition, and performing the adjusting of the next polyphase filter coefficient index value to the new polyphase filter coefficient index value in response to the multirate filter operating at the preset boundary condition.

6. The method of claim 5, self-correcting the polyphase multirate filter further comprises:
calculating a result of n+N, where n is a counter value representing an index of a commutator of the multirate filter, N is a downsampling factor corresponding to a frequency rate of the multirate output clock signal relative to the measurement clock;
checking a value of a new input data flag that is automatically set at the baseband modem on receipt of each new input data from within the data stream, wherein the new input data flag is cleared in response to completion of a generation of the output data sample;
in response to determining that (n+N)≥M and the new input flag indicates that no new input data has been received, setting the value of the index, n, to M−1, wherein M is an upsampling factor corresponding to a frequency rate of the resampling filter input clock signal relative to the measurement clock and M represents a total number of polyphase filter components within the multirate filter;
in response to determining that (n+N)<M and the new input flag indicates that no new input data has been received, applying (n+N) as a next value of the index;
in response to determining that (n+N)<M and the new input flag indicates that new input data has been received, setting the value of the index, n, to 0; and
in response to determining that (n+N)≥M and the new input flag indicates that new input data has been received, setting the value of the index to (n+N)−M.

7. The method of claim 4, further comprising:
detecting at least one event that changes a timing relationship between the resampling filter input clock signal and the multirate output clock signal; and
in response to a detection of at least one event, re-initializing the polyphase multirate filter, performing a new measurement of the phase relationship, and selecting a new initial polyphase filter coefficient index from a newly selected quantized mapping table that provides mappings derived from a measured timing relationship of a similar resampling filter input clock signal and a similar multirate output clock signal as a newly-determined current filter input clock signal and a newly-determined multirate output clock signal, utilizing a same measurement clock.

8. The method of claim 7, wherein the at least one event includes at least one of:
powering up of the multirate filter; initiating the multirate filter; advancing at least one of the input data stream, the sampling clock of the data stream, and the sampling clock of the filter;
retarding or delaying at least one of the input data stream, the sampling clock of the data stream, and the sampling clock of the filter; detection of jitter within one of the resampling clock and the output clock; a start of I/Q data transmission; a half chip delay for Offset QPSK; and a general timing change.

9. The method of claim 1, wherein updating of the initial filter coefficient index value comprises:
performing the automatically updating of the initial filter coefficient value to the next filter coefficient value by (a) adding a downsampling factor, N, to a value of a counter, n, to obtain a Result, (b) determining a modulus of the Result divided by an upsampling factor, M; and (c) applying the modulus as a new value of n, corresponding to the next filter coefficient index value;
selecting a next polyphase filter component corresponding to the next filter coefficient index value, wherein the next polyphase filter component is selected from the plurality of polyphase filter components; and
computing a new output data sample utilizing the selected next polyphase filter component.

10. The method of claim 1, wherein:
the polyphase multirate filter is located within one of a baseband front end and a radio frequency (RF) integrated circuit (IC) of an RF communication device that supports receipt of incoming data streams and generation of outgoing data streams utilizing a plurality of clock frequencies;
when the data stream is an outgoing data stream generated by the communication device, the current resampling filter input clock signal and the current multirate output clock signal respectively represent a baseband modem clock signal and an RF sampling clock signal of the RFIC; and
when the data stream is an incoming data stream received by the communication device, the current resampling filter input clock signal and the current multirate output clock signal respectively represent the RF sampling clock signal and the baseband modem clock signal.

11. A system that enables real time configuration of a resampling filter to sample a data stream, the system comprising:
a polyphase multirate filter having a plurality of individually selectable polyphase filter components to filter input data to generate an output data sample; and
a controller of the polyphase multirate filter, wherein the controller is configured to, in response to a detection of a data stream:

measure a current phase relationship between a current resampling filter input clock signal and a current multirate output clock signal;

identify an initial polyphase filter coefficient index corresponding to the measured phase relationship using a mapping of the measured phase relationship within a pre-generated quantized mapping table, wherein the pre-generated quantized mapping table comprises an association of each of a plurality of sets of different values of measured phase relationships with one initial polyphase filter coefficient index that identifies a particular polyphase filter component of the multirate filter, and wherein the multirate filter comprises a plurality of polyphase filter components each uniquely identified by a different polyphase filter coefficient index and each capable of being individually selected to generate a different output data sample from processing received data;

select a corresponding polyphase filter component from within the multirate filter using the initial polyphase filter coefficient index identified;

configure the multirate filter to pass data from the data stream through the corresponding polyphase filter component, wherein the corresponding polyphase filter component selected generates an initial output data sample from data of the data stream inputted to the multirate filter, and wherein the initial output data sample is derived utilizing sampling functions specific to that corresponding polyphase filter component; and in response to a request for generation of a next output data sample, update the initial polyphase filter coefficient index to a calculated next polyphase filter coefficient index value.

12. The system of claim 11, wherein:

the controller is configured to measure a phase relationship by being configured to measure a time interval between a first rising edge of the resampling filter input clock signal and a first rising edge of the multirate output clock signal using a measuring clock signal that is faster than both the resampling filter input clock signal and the multirate output clock signal, wherein the time interval is measured in units of full signal counts of the measuring clock signal; and a total number of the full signal counts of the measuring clock within the time interval is mapped within the pre-generated quantized mapping table to one initial polyphase filter coefficient index, and each polyphase filter coefficient index is uniquely mapped to a set of one or more different numbers of signal counts of the faster measuring clock signal.

13. The system of claim 12, wherein the controller is further configured to:

select a related quantized mapping table from among at least one quantized mapping table stored within a data structure at a storage location, wherein the related quantized mapping table provides specific mappings of filter coefficient indices to measurement counter values generated utilizing the measuring clock to measure the time interval between a similar resampling filter input clock signal rate and a similar multirate output clock signal rate as a clock signal rate of the current resampling filter input clock signal and the current multirate output clock signal, wherein the pre-generated quantized mapping table comprises individual initial polyphase component indices each mapped to at least one measurement counter value corresponding to a number of full signal counts of the measuring clock within the measured time interval.

14. The system of claim 11, wherein the controller is further configured to:

self correct the multirate filter by being configured to adjust the next polyphase filter coefficient index value to a new polyphase filter coefficient index value within a pre-set range of acceptable polyphase filter coefficient index values in response to a detection of an occurrence of at least one pre-identified trigger condition that indicates at least one of (a) a change in the phase relationship between the resampling filter input clock signal and the multirate output clock signal and (b) an error resulting from one of the initial polyphase coefficient index selected and the next polyphase filter coefficient index value calculated.

15. The system of claim 14, wherein the controller is configured to self-correct the polyphase multirate filter by being configured to:

detect an arrival of a next data at a different time than a pre-established expected time for arrival of the next data, wherein said arrival of the next data at a different time indicates an existence of jitter within at least one of an input and an output clock associated with the polyphase multirate filter; and in response to a detection of the arrival of the next data at the different time, determine whether the multirate filter is operating at a preset boundary condition, and perform the adjusting of the next polyphase filter coefficient index value to the new polyphase filter coefficient index value in response to the multirate filter operating at the preset boundary condition.

16. The system of claim 15, wherein the controller is configured to self-correct the polyphase multirate filter by being configured to:

calculate a result of n+N, where n is a counter value representing an index of a commutator of the multirate filter, N is a downsampling factor corresponding to a frequency rate of the multirate output clock signal relative to the measurement clock;

check a value of a new input data flag that is automatically set at the baseband modem on receipt of each new input data from within the data stream, wherein the new input data flag is cleared in response to completion of a sampling function to generate the output data sample;

in response to a determination that (n+N)≥M and the new input flag indicates that no new input data has been received, set the value of the index, n, to M−1, wherein M is an upsampling factor corresponding to a frequency rate of the resampling filter input clock signal relative to the measurement clock and M represents a total number of polyphase filter components within the multirate filter;

in response to a determination that (n+N)<M and the new input flag indicates that no new input data has been received, apply (n+N) as a next value of the index;

in response to a determination that (n+N)<M and the new input flag indicates that new input data has been received, set the value of the index, n, to 0; and in response to a determination that (n+N)>M and the new input flag indicates that new input data has been received, set the value of the index to (n+N)−M.

17. The system of claim 14, wherein the controller is configured to:

detect at least one event that changes a timing relationship between the resampling filter input clock signal and the multirate output clock signal; and in response to a detection of the at least one event, signal the RF module to re-initialize the polyphase multirate filter, perform a new measurement of the phase relationship, and select a new initial polyphase filter coefficient index from a newly selected quantized mapping table that provides mappings derived from a measured timing relationship of a similar resampling filter input clock signal and a similar multirate output clock signal as a newly-determined current filter input clock signal and a newly-determined multirate output clock signal, utilizing a same measurement clock.

18. The system of claim 17, wherein the controller is configured to:

perform the update of the initial filter coefficient value to the next filter coefficient value by (a) adding a downsampling factor, N, to a value of a counter, n, to obtain a Result, (b) determining a modulus of the Result divided by an upsampling factor, M; and (c) applying the modulus as a new value of n, corresponding to the next filter coefficient index value;

select a next polyphase filter component corresponding to the next filter coefficient index value, wherein the next polyphase filter component is selected from the plurality of polyphase filter components; and compute a new output data sample utilizing the selected next polyphase filter component.

19. The system of claim 11, further comprising:

an RF module; and a baseband modem coupled to the RF module;

wherein the polyphase multirate filter is located within one of (a) the RF module and (b) a baseband front end;

wherein, when the data stream is a data transmission stream generated by the communication device, the current resampling filter input clock signal and the current multirate output clock signal respectively represent the baseband modem clock signal and an RF sampling clock signal of the RFIC; and wherein, when the data stream is a data receiving stream received by the communication device, the current resampling filter input clock signal and the current multirate output clock signal respectively represent the RF sampling clock signal and the baseband modem clock signal.

20. A radio frequency (RF) communication device comprising:

an RF module;

a baseband modem coupled to the RF module;

a polyphase multirate filter having a plurality of individually selectable polyphase filter components module and being configured to communicate outgoing data from and incoming data to the baseband modem, wherein the polyphase multirate filter is located within one of (a) the RF module, and (b) a baseband front end;

a controller of the polyphase multirate filter, wherein the controller is configured to, in response to a detection a data stream:

measure a current phase relationship between a current resampling filter input clock signal and a current multirate output clock signal by measuring a time interval between a first rising edge of the resampling filter input clock signal and a first rising edge of the multirate output clock signal using a measuring clock signal that is faster than both the resampling filter input clock signal and the multirate output clock signal, wherein the time interval is measured in units of full signal counts of the measuring clock signal, and wherein a total number of the full signal counts of the measuring clock within the time interval is mapped within a pre-generated quantized mapping table to one initial polyphase filter coefficient index, and each polyphase filter coefficient index is uniquely mapped to a set of one or more different numbers of signal counts of the faster measuring clock signal, wherein when the data stream is a data transmission stream generated by the communication device, the current resampling filter input clock signal and the current multirate output clock signal respectively represent the baseband modem clock signal and an RF sampling clock signal of the RF module, and wherein when the data stream is a data receiving stream received by the communication device, the current resampling filter input clock signal and the current multirate output clock signal respectively represent the RF sampling clock signal and the baseband modem clock signal;

identify an initial polyphase filter coefficient index corresponding to the measured phase relationship using a mapping of the measured phase relationship within the pre-generated quantized mapping table, wherein the pre-generated quantized mapping table comprises an association of each of a plurality of sets of different values of measured phase relationships with one initial polyphase filter coefficient index that identifies a particular polyphase filter component of the multirate filter, and wherein the multirate filter comprises a plurality of polyphase filter components each uniquely identified by a different polyphase filter coefficient index and each capable of being individually selected to generate a different output data sample from processing received data;

select a corresponding polyphase filter component from within the multirate filter using the initial polyphase filter coefficient index identified;

configure the multirate filter to pass data from the data stream through the corresponding polyphase filter component, wherein the corresponding polyphase filter component selected generates an initial output data sample from data of the data stream inputted to the multirate filter, and wherein the initial output data sample is derived utilizing sampling functions specific to that corresponding polyphase filter component;

in response to a request for generation of a next output data sample, update the initial polyphase filter coefficient index to a calculated next polyphase filter coefficient index value;

in response to a detection of at least one pre-identified trigger condition that indicates at least one of (a) a change in a timing relationship between the resampling filter input clock signal and the multirate output clock signal and (b) an error resulting from one of the initial polyphase coefficient index selected and the next polyphase filter coefficient index value calculated, self-correct the multirate filter by adjusting the next polyphase filter coefficient index value to a new polyphase filter coefficient index value within a preset range of acceptable polyphase filter coefficient index values, wherein the adjusting to the new polyphase filter coefficient index value includes: performing a new measurement of the phase relationship; and selecting a new initial polyphase filter coefficient index from a newly selected quantized mapping table that provides mappings derived from a measured timing relationship of a similar resampling filter input clock signal and a similar multirate output clock signal as a newly-determined current filter input clock signal and a newly-determined multirate output clock signal, utilizing a same measurement clock.

21. The RF communication device of claim 20, wherein the controller is configured to self-correct the polyphase multirate filter by being configured to:

detect an arrival of a next data at a different time than a pre-established expected time for arrival of the next data, wherein said arrival of the next data at a different time indicates an existence of jitter within at least one of an input and an output clock associated with the polyphase multirate filter; and in response to a detection of the arrival of the next data at the different time, determine whether the multirate filter is operating at a preset boundary condition, and performing the adjusting of the next polyphase filter coefficient index value to the new polyphase filter coefficient index value in response to the multirate filter operating at the preset boundary condition.

* * * * *

UNITED STATES PATENT AND TRADEMARK OFFICE
CERTIFICATE OF CORRECTION

PATENT NO.        : 8,693,601 B2
APPLICATION NO.   : 13/342258
DATED             : April 8, 2014
INVENTOR(S)       : Victor Adut et al.

Page 1 of 1

It is certified that error appears in the above-identified patent and that said Letters Patent is hereby corrected as shown below:

In the claims

| | |
|---|---|
| Column 19, line 36 (Claim 6): | After "The method of claim 5," insert --wherein--; |
| Column 22, line 6 (Claim 14): | Replace "self correct" with --self-correct--; |
| Column 22, line 63 (Claim 16): | Replace "(n+N)>M" with --(n+N)≥M--; and |
| Column 23, line 57 (Claim 20): | Replace "detection a" with --detection of a--. |

Signed and Sealed this
Twenty-second Day of March, 2016

Michelle K. Lee
*Director of the United States Patent and Trademark Office*